United States Patent [19]

Butt

[11] Patent Number: 4,967,260
[45] Date of Patent: Oct. 30, 1990

[54] HERMETIC MICROMINIATURE PACKAGES

[75] Inventor: Sheldon H. Butt, Godfrey, Ill.

[73] Assignee: International Electronic Research Corp., Burbank, Calif.

[21] Appl. No.: 188,322

[22] Filed: May 4, 1988

[51] Int. Cl.⁵ .................... H01L 23/06; H01L 23/14
[52] U.S. Cl. ......................................... 357/70; 357/74; 357/80; 357/73
[58] Field of Search .................... 347/74, 70, 73, 80, 347/68, 71; 174/52.4

[56] References Cited

U.S. PATENT DOCUMENTS

| | | | |
|---|---|---|---|
| 3,341,369 | 9/1967 | Caule et al. | 148/3 |
| 3,475,227 | 10/1969 | Caule et al. | 148/6.31 |
| 3,826,627 | 7/1974 | Pryor et al. | 29/195 |
| 3,826,629 | 7/1974 | Pryor et al. | 29/195 |
| 4,195,193 | 3/1980 | Grabbe et al. | 174/52.4 |
| 4,209,355 | 6/1980 | Burns | 156/630 |
| 4,234,666 | 11/1980 | Gursky | 428/573 |
| 4,289,922 | 9/1981 | Devlin | 174/52.4 |
| 4,411,719 | 10/1983 | Lindberg | 156/64 |
| 4,434,016 | 2/1984 | Saleh et al. | 148/12.7 |
| 4,510,017 | 4/1985 | Barber | 156/651 |
| 4,524,238 | 6/1985 | Butt | 174/52.4 |
| 4,594,221 | 6/1986 | Caron et al. | 420/485 |
| 4,607,276 | 8/1986 | Butt | 357/79 |
| 4,656,499 | 4/1987 | Butt | 357/74 |
| 4,701,781 | 10/1987 | Sankhagowit | 357/70 |
| 4,704,626 | 11/1987 | Mahulikar et al. | 357/74 |
| 4,706,811 | 11/1987 | Jung et al. | 206/331 |
| 4,721,992 | 1/1988 | Emamjomeh et al. | 357/70 |
| 4,805,009 | 2/1989 | Pryor et al. | 357/74 |

OTHER PUBLICATIONS

Chapter 6, entitled "Image Transfer" of Printed Circuits Handbook (2nd Edition) edited by Clyde F. Coombs, (1979).
Article by G. Y. Y. Chen, entitled "Recent Advances in Laser Directed Imaging for PWBs" p. 41 of Jan. 86 edition Printed Circuit Fabrication.

Primary Examiner—Rolf Hille
Assistant Examiner—S. V. Clark
Attorney, Agent, or Firm—Beehler & Pavitt

[57] ABSTRACT

A hermetic tape package and a process for forming the hermetic tape package are disclosed. The package is capable of high lead densities and occupies a minimum of space. A test frame is incorporated into the package to permit testing of an electronic device prior to sealing the package.

32 Claims, 4 Drawing Sheets

PRIOR ART

HERMETIC MICROMINIATURE PACKAGES

While the invention is subject to a wide range of applications, it is particularly suited for housing electronic devices. In particular, housing a semiconductor device requiring a high lead density.

Electronic devices are typically manufactured from a semiconductor material, for example, silicon, germanium or gallium/arsenide. Circuitry is formed on one surface of the device. Around the periphery of that surface are input/output pads to facilitate electrical connection of the device to the outside environment.

A package designed to house the electronic device is required to serve several functions. It protects the device from moisture and other external contamination. It protects the device from mechanical damage. The package also contains an electrically conductive means to transport electrical signals to and from an external source.

The conductive means is traditionally a leadframe, a stamped piece of metal or a metal alloy about 0.010 inches thick which is disposed between the base and lid components of the package. The leadframe is connected to the electronic device by bond wires. These bond wires are typically about 0.001 inch in diameter and may consist of gold, aluminum or copper.

As the circuitry on the electronic device becomes more complex, a larger number of input/output pads are required. A lead is required to contact electrically with each pad, so the number of leads required correspondingly increases.

Generally, metal stamping rules dictate the distance between leads cannot be much less than the thickness of the leads. For a leadframe stamped from 0.010 inch stock, the leads are about 0.010 inches wide and separated by about 0.010 inches. The centers of two adjoining leads are about 0.020 inches apart. Conventional leadframes are suitable for devices requiring 16 or 32 leads. However, when the device requires several hundred leads, conventional leadframes are not satisfactory.

Electronic device manufacturers desire to minimize package dimensions. A minimum area package is advantageous for several reasons. First, the package occupies less space. In apparatus such as aircraft or satellites, size and weight considerations are quite important. Secondly, the electronic device generates heat. Removal of the heat is important to increase the life of the electronic device. Thermal management is often easier with a smaller package design.

Attempts to increase the lead count have focused on better alignment of the leadframe, as disclosed in U.S. Pat. No. 4,289,922 to Devlin or the use of thinner leadframe materials. Thinner leadframes, typically referred to as tape leadframes, are generally about 0.002 inches thick to about 0.004 inches thick. Following the stamping rules discussed above, thinner stock material permits closer spacing of the leads.

Along with closer spacing, comes a problem with flexibility and registration. The leads must be more accurately positioned. Thin metal tape has little inherent structural strength and is difficult to position properly. These problems have been addressed through the use of tape automated bonding, usually referred to as TAB.

TAB leadframe tapes are disclosed in U.S. Pat. Nos. 4,209,355 issued to Burns, 4,234,666 issued to Gursky and 4,721,992 issued to Emamjomeh et al. TAB leadframes are usually one, two or three layer materials containing a metal foil and usually a dielectric backing to supply structural strength. Alignment holes are provided to allow accurate positioning of the leads.

Complex semiconductor devices often require environmental protection. The package should be hermetic which is defined as exhibiting a helium leak rate of less than $5 \times 10^{-8}$ cm$^3$/sec. Plastic encapsulated packages or packages using polymer adhesives for sealing are unable to meet this requirement.

Glass sealed packages are capable of achieving the hermeticity requirement. A glass sealed tape package is disclosed in U.S. Pat. No. 4,607,276 issued to Butt. The present invention has many advantages over earlier glass sealed tape packages.

It is an object of the present invention to provide a hermetic tape package with minimum size requirements.

It is another object of the present invention to provide for high density spacing of the leads.

It is an advantage of the present invention that it provides a means to test the electronic device prior to sealing the package.

It is yet another object of the invention to provide a method to shape the leads for interconnecting to an external device.

It is an advantage of the present invention that the means for lead shaping minimizes solder bridging.

The invention and further developments of the invention are now elucidated by means of preferred embodiments shown in the drawings:

Figure 1:
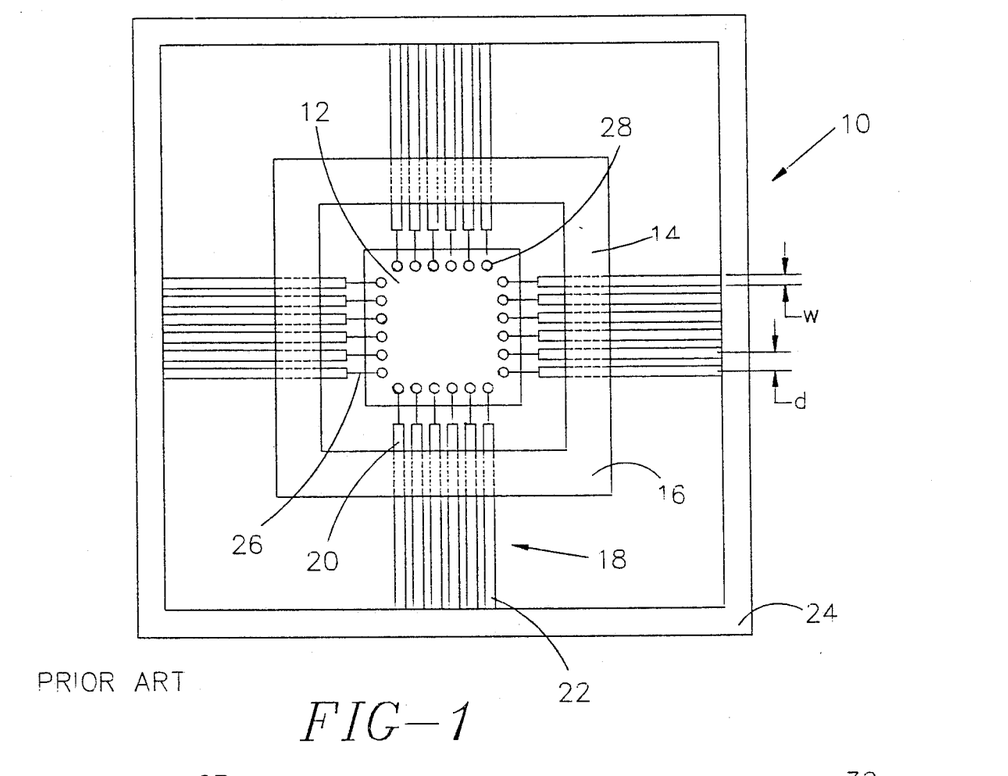
FIG. 1 illustrates a quad package containing a conventional leadframe.

FIG. 1 shows a conventional quad pack 10. To increase lead density, quad pack packages supply leads to four sides of the semiconductor device or chip 12. The package includes a base component 14 to Which the semiconduotor device is bonded.

Either before of after bonding the semiconductor device 12 to the base component 14, a bonding layer 16 is applied to the base component. While this bonding layer may be glass, polymer adhesive, or other dielectric sealing means, it is preferred to use a sealing glass for hermeticity. The composition of the bonding layer is preferably chosen to have a coefficient of thermal expansion about equal to that of the base 14 and cover component (not shown) of the package 10. If a polymer adhesive is used, the compliancy of the polymer may negate the need to approximately match thermal expansion coefficients.

If a sealing glass is used, a leadframe 18 is next embedded into the bonding layer 16. Alternatively, the base component may be provided with sidewalls containing apertures through which the leadframe passes. The leadframe is comprised of lead fingers 20 and lead ends 22. Tie bars 24 are sometimes added to support the lead ends and protect them from bending during processing. Each lead finger 20 is electrically connected to the semiconductor device 12. Electrical connection is achieved by bonding a wire 26 to the lead finger 20 and a metallized input/output pad 28 on the face of the semiconductor device.

A cover component (not shown) is then aligned with the base component 14 and bonded to the opposite side of the leadframe 18 thereby completing the electronic package 10.

Applying the stamping rule shows the limitations of the conventional quad package. A conventional leadframe is 0.010 inches thick so the width of each lead "w" is 0.010 inches and the center to center distance between leads "d" is 0.020 inches. If the semiconductor device is 0.500 inches by 0.500 inches, a typical size for very large scale integrated circuits, the lead density is limited to:

$$0.500 = 0.020x - 1 \quad (1)$$

where 0.500 is the chip length, 0.020 is the inner lead spacing and $-1$ compensates for the edges of the first and last lead.

Using equation 1 the maximum lead density is 24 leads per side or 96 leads for the quad pack. This package is not adequate for very large scale integrated circuits requiring in excess of 100 leads.

The invention of the present application overcomes the lead count limitations of conventional quad packs and permits the manufacture of packages with much denser lead counts. While the invention is being particularly described as a quad package, it should be realized the invention is readily adaptable to any desired package including dual-in-line and single-in-line packages as well as leadless chip carriers. The invention is best understood with attention to FIGS. 2A–2F which illustrate the assembly of a test frame.

Figure 2A:
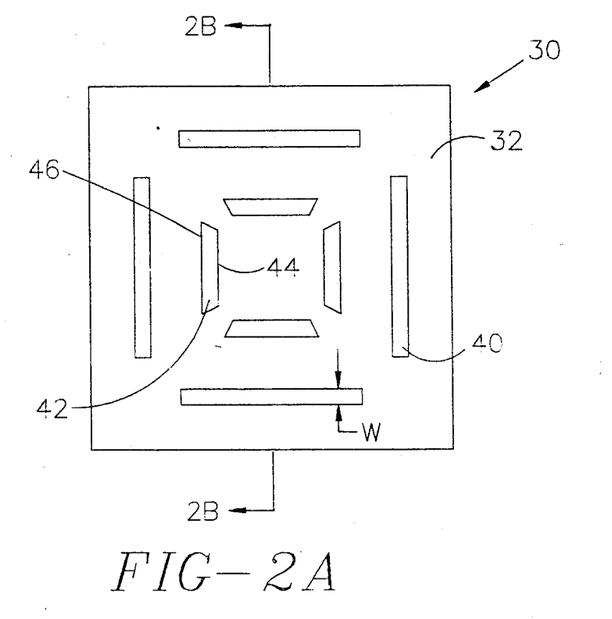
FIGS. 2A-2F illustrate in schematic and cross section a process for assembling a test frame in accordance with the present invention.
Figure 2B:
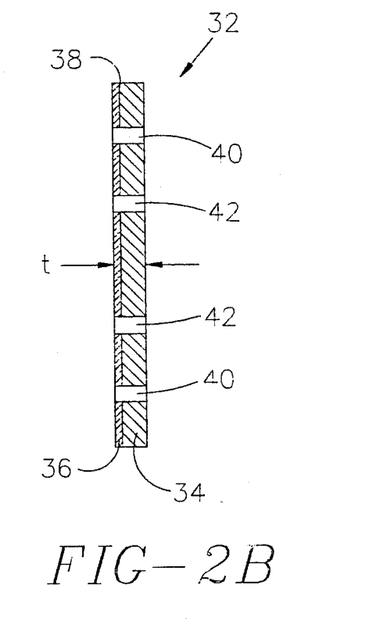

FIG. 2A shows a first ring frame 30. The ring frame, as shown in cross-section in FIG 2B, is a composite material 32 comprised of a substrate 34 and a glass layer 36. The substrate 34 may be any fairly rigid material which does not distort at temperatures required for glass sealing. Suitable materials for the substrate 34 are ceramics, glasses, metals and metal alloys. Particularly favored materials are metals or metal alloys capable of forming a refractory oxide such as copper alloys C63800 or C72400. Copper alloys such as C70250 and the L high conductivity alloy C19700 are also preferable if coated with another material which forms a refractory oxide. This second material may be applied by cladding or plating. An ideal coating material is nickel, as disclosed in U.S. Pat. Ser. No. 4,796,083 by Cherukuri et al.

Alloy 63800 contains 2.5–3.1% aluminum, 1.5–2.1% silicon and the balance copper as described in U.S. Pat. Nos. 3,341,369 and 3,475,227 issued to Caule et al. A refractory oxide layer formed substantially of aluminum oxide ($Al_2O_3$) may be produced by any desired method. For example, the alloy may be preoxidized by heating to a temperature of between about 330° C. and 820° C. in gases having an extremely low oxygen content such as 4% hydrogen, 96% nitrogen and a trace of water.

Alloy C63800 may not be preferred for all packaging applications. The alloy anneals at glass sealing temperatures and the assembled ring frame may be subject to distortion in the softened state. A more preferred alloy is a precipitation hardened alloy suitable for glass sealing such as copper alloy C72400.

Alloy C72400 consists essentially of from about 10% to about 15% nickel, from about 1% to about 3% aluminum, up to about 1% manganese, from about 0.05% to less than about 0.5% magnesium and the balance copper as disclosed in U.S. Pat. No. 4,434,016 to Saleh et al.

Another more preferred copper based alloy is C70250. Alloy C70250 consists essentially of from about 2 to about 4.8 weight percent nickel, from about 0.2 to about 1.4 weight percent silicon, from about 0.05 to about 0.45 weight percent magnesium and the balance copper. Alloy C7025 is disclosed in U.S. Pat. No. 4,594,221 to Caron et al. Alloy C7025 does not form a suitable refractory oxide layer so a coating with a second material, for example, by nickel plating, may be desired for improved glass sealability.

The glass layer 36 is bonded by being deposited and fired on a first surface 38 of substrate 34 forming the composite 32 of first ring frame 30. Glass-metal composites have been disclosed in U.S. Pat. Nos. 3,826,627 and 3,826,629, both issued to Pryor et al.

The glass is selected to have a coefficient of thermal expansion approximately matching the coefficient of thermal expansion of the substrate. For copper base alloys, a particularly suitable sealing glass consists essentially of at least 50 molar percent $SiO_2$, from about 10 to about 20 molar percent BaO, from about 20 to about 30 molar percent of an alkaline oxide component, the alkaline oxide component is selected from the group consisting of $Na_2O$, $K_2O$ and LiO, up to about 5 molar percent $Al_2O_3$ and up to about 10 percent of an additive to achieve desired properties. The additive may be a material like lead oxide to adjust the melting temperature of the glass or another additive such as $B_2O_3$, $P_2O_5$, MgO, CaO, $GeO_2$, SrO or mixtures of these additives. This glass has a coefficient of thermal expansion in the range of from about $160 \times 10^{-7}$ in/in/° C. to about $180 \times 10^{-7}$ in/in/° C. and melts at a temperature of about 700° C. to about 800° C. The glass is more fully described in U.S. patent application Ser. No. 169,635 filed Mar. 17, 1988.

Referring back to FIG. 2A, first ring frame 30 is provided with a plurality of exterior slots 40 and interior slots 42 disposed around the center of the ring frame. Interior slots 42 form a generally square or rectangular shape with an inner edge 44 forming a square or rectangle somewhat smaller than the periphery of the semiconductor device (not shown) to be packaged. The outer edge 46, forms a square or rectangle somewhat larger than the periphery of the semiconductor device. The actual shape formed is dependent on the shape of the semiconductor die to be housed. The shape typically conforms with the shape of the die.

Exterior slots 40, likewise form an essentially rectangular shape. As indicated in FIGS. 2A and 2B, the width, w, of the exterior slots 40 is preferably somewhat larger than the thickness, t, of the composite 32.

While the slots 40 and 42 are shown to define a generally square to rectangular shape, they may form any desired shape. As will be shown hereinbelow, the shape is dependent on the shape of the semiconductor device to be housed and the positioning of input/output pads on that device. As most devices are square or rectangular, these shapes are being used for exemplary purposes.

The glass is applied, for example, by screening, over the entire first surface 38 of substrate 34 as shown in FIG. 2B. The slots 40 and 42 are not filled in with the glass. The glass is bonded to the substrate by firing at temperature above 200° C, and generally from 200° C. to 900° C., depending on the glass selected, for a period of time selected to form an adherent bond. For better glass adhesion, the surface of the substrate may be preoxidized. For example, alloy C63800 may be preoxidized in gases having an extremely low oxygen content. The alloy may be placed in an atmosphere of 4% hydrogen, 96% nitrogen and a trace of oxygen from a trace of water mixed with the gas. This gas may be heated to a temperature of between 330° C. and about 820° C. Depending on the temperature and the amount of time the alloy is left in the heated gas, a refractory oxide layer of a desired thickness is formed on the surface of the alloy.

Cladding, as disclosed in U.S. Pat. No. 4,524,238, issued to Butt, or coating with a second material by a process such as electroplating, as disclosed in U.S. Pat. No. 4,796,083, are useful if the alloy does not readily form a refractory oxide layer. For example, alloy C19700 may be clad with a layer of alloy C63800 to facilitate bonding. The clad layer is generally about 0.0005 inches thick. The clad layer usually has poorer thermal conductivity than the substrate layer, so a thinner coating is often desired. A coating thickness of a few microns is achievable by plating, for example, electroplating nickel. It is often desirable to coat the edges of the substrate to improve glass wetting to the edges.

Figure 2C:
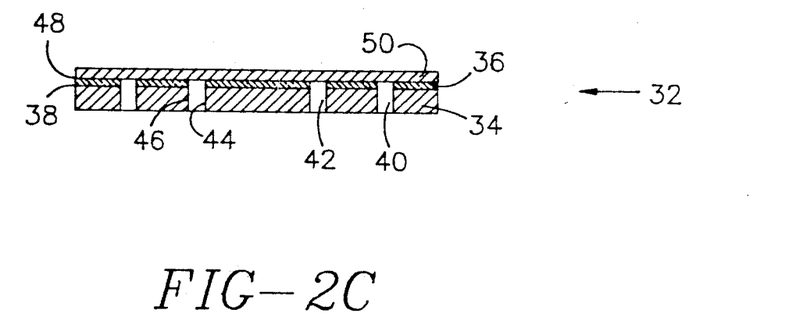

Referring now to FIG. 2C, a layer of metallic foil 50, is bonded to a surface 48 of the sealing glass 36. The foil is preferably copper or a copper base alloy. Since the foil is supported by the composite 32, the foil does not require structural strength and may be quite thin. Generally, the foil is under about 0.010 inches thick, preferably, the foil is under about 0.005 inches thick and most preferably, the foil is between about 0.0007 inches thick and about 0.0028 inches thick. The foil is bonded to the glass by heating to a temperature above about 200° C. and preferably between about 200° C. and 900° C. Bonding is done in an atmosphere which is preferably neutral or slightly reducing to limit oxidation of the copper foil.

In some cases, the slots 40, 42 may be of sufficient width and the firing temperature sufficiently high that the copper foil will sag during glass sealing. It is often desirable to insert temporary supports through the slots to support the foil during bonding. These supports are made from a material which does not bond to the glass, for example, graphite.

Leads are next formed from the foil by any conventional process such as photolithography. A description of photolithography as applied to circuit patterns, may be found in Chapter 6, entitled "Image Transfer" of *Printed Circuits Handbook* (2nd edition) edited by Clyde F. Coombs (1979). Briefly, the process entails applying a photosensitive resist over the copper foil. A mask defining the desired circuit pattern is placed over the resist. A light source exposes those areas not shielded by the mask. The photoresist polymerizes in the exposed areas and becomes resistant to a first solvent. The photoresist which did not polymerize is dissolved by the first solvent. The exposed metal foil is then etched using a suitable acid or combination of acids to expose the layer of sealing glass. A second solvent is applied to dissolve the polymerized resist leaving copper traces forming the desired lead pattern. Photolithography techniques employing positive or negative photoresists may be employed as desired. To prevent lead sagging during photolithography, temporary supports may be inserted into slots 40 and 42 if needed. The support may be any easily removable material, for example, wax.

Figure 2D:
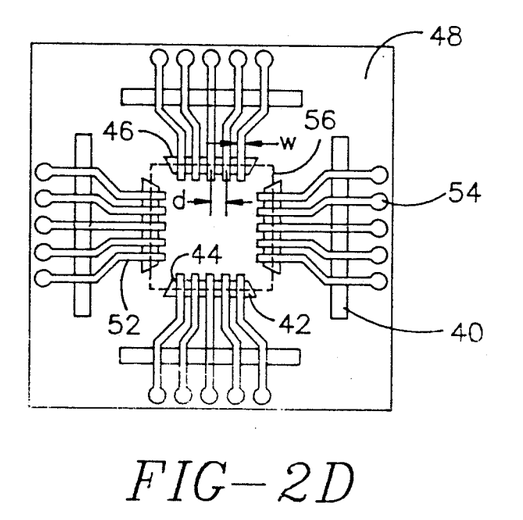

Referring now to FIG. 2D, the copper foil has been etched to form leads 52. Although only a limited number of leads are shown, any number of leads may be employed. It is to be realized that the leads are supported by the composite and are formed by a chemical process rather than stamping. Therefore, the lead width is not governed by the stamping rules also lead shape and configuration may be freely adjusted as shown. The resolution of photolithograpy is very high. Image placement within 0.001 inch over an 18 inch × 24 inch printed circuit board is achievable according to the article by G. Y. Y. Chen entitled "Recent Advances in Laser Direct Imaging for PWBs" which appeared at Page 41 of the January 1986 edition of *Printed Circuit Fabrication*. With high resolution photolithography and support of the leads 52 by the composite, the lead density of the quad package of the present invention is many times that of the conventional quad pack. With a lead width, w, of 0.002 inches separated by a center-to-center distance, d, of 0.002", the lead count for a semiconductor device 0.500×0.500 inches would be:

$$0.500 = 0.004x - 1 \tag{2}$$

or 124 leads per side or 496 leads for the quad package. The lead density is almost five times that of a conventional quad package.

FIG. 2D shows one end of the leads 52 terminate at a test pad 54. The test pads are merely a region, usually circular, of metallic foil large enough to contact a probe. As detailed hereinbelow, an advantage of the present invention is the ability to test the semiconductor device prior to sealing the package. Of course, if pre-testing is not a requirement, the test pads 54 may be omitted. The other end of the leads 52 terminates inwardly of the interior slot 42. The periphery 56 of the not yet attached semiconductor device is shown in phantom to indicate the position of the leads 52 and the interior slot 42 relative to the semiconductor device.

Figure 2E:
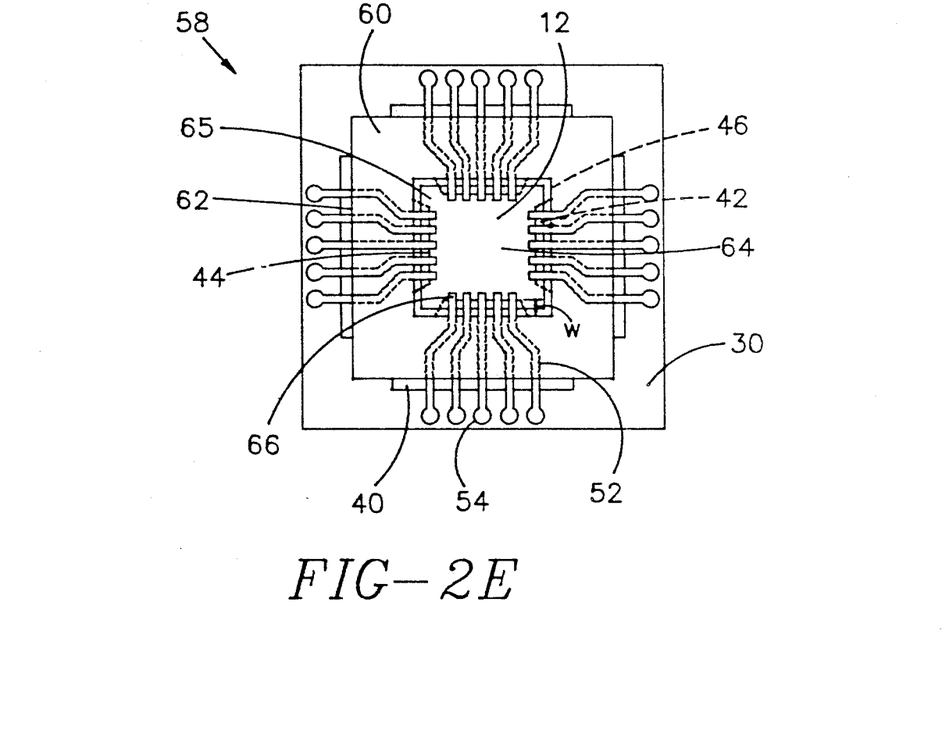
Figure 2F:
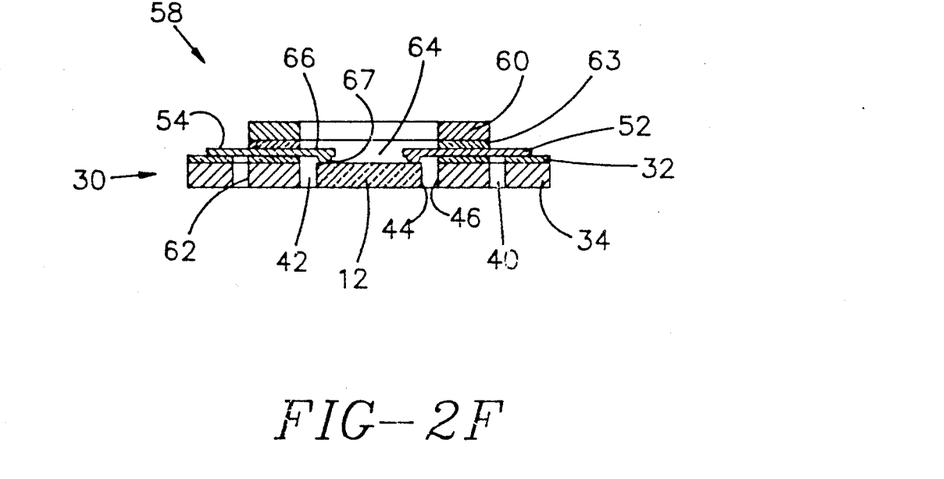

Referring now to FIGS. 2E and 2F, the test frame 58 is completed by sealing a second ring frame 60 to the first ring frame 30. The second ring frame 60 is of the proper dimensions to approximately fit within the area defined by the inner edge 62 of outer slots 40 and the outer edge 46 of inner slots 42 (shown in phantom). The upper ring frame is bonded to the lower ring frame by a sealing glass 63. The leads 52 are sandwiched between two layers of glass 63 and 36. The composition of the second glass layer 63 may be identical to the composition of the first glass layer 32 or a different glass may be used. Generally, the upper ring frame 60 will be made from the same material as the lower ring frame 30 as a matched glass is preferred. In a particularly preferred embodiment, the first 30 and second 60 ring frames are formed from copper alloy C72400. C72400 is characterized by high strength and resistance to excessive softening during glass bonding. However, if the upper ring frame is a material having a different coefficient of thermal expansion, a graded sealing system, as disclosed in U.S. Pat. No. 4,704,626 issued to Mahulikar et al. may be used.

The second ring frame 60 is bonded to the first ring frame 30 by an appropriate thermal cycle. The bonding time and temperature is dependent upon the glass selected. Generally, the bonding temperature is between about 400° C. and about 800° C. for a time between about 10 minutes and two hours. After bonding, the first ring frame 30 is severed, for example, by laser machining along the inner edge 44 of the interior slots 42, creating central cavity 64. The lead finger 66 extend in cantilever fashion into the central cavity 64 for a distance equal to the width, w, of the interior slot 42. The small tubes 65 between the interior slots 42 are severed in a similar fashion.

The test frame 58 is now complete and adaptable for electrical bonding of a semiconductor device. The test frame 58 and leads 52 may be coated with another material to facilitate bonding of the leads and soldering of the test frame to the electronic package. Suitable coatings include electroplated nickel, tin, gold, or alloys thereof.

Finally, a semiconductor device 12 is bonded to lead fingers 66 by conventional TAB techniques, such as gang bonding, in which all leads are electrically connected to the input/output pads by thermocompression bonding in one operation. To facilitate bonding, it is common to place bonding bumps 67 on either the lead fingers 66 or input/output pads.

Another advantage of the present invention is apparent with the assembled test frame. Test pads 54 are utilized to test the characteristics of the semiconductor device 12 prior to sealing the package. A voltage may be applied, a resistance reading taken or any other electrical test required by contacting a probe to the desire test pad. If the electronic device is satisfactory, the test frame is sealed. If unsatisfactory, the assembly may be discarded without spending additional time and money to complete the electronic package. Methods of testing TAB tapes are disclosed in U.S. Pat. No. 4,411,719 issued to Lindberg, U.S. Pat. No. 4,510,017 issued to Barber and U.S. Pat. No. 4,701,781 issued to Sankhagowit. Ring shaped supports designed to support a tape leadframe are disclosed in U.S. Pat. No. 4,195,193 issued to Grabbe et al. and U.S. Pat. No. 4,706,811 issued to Junq et al.

Figure 3:
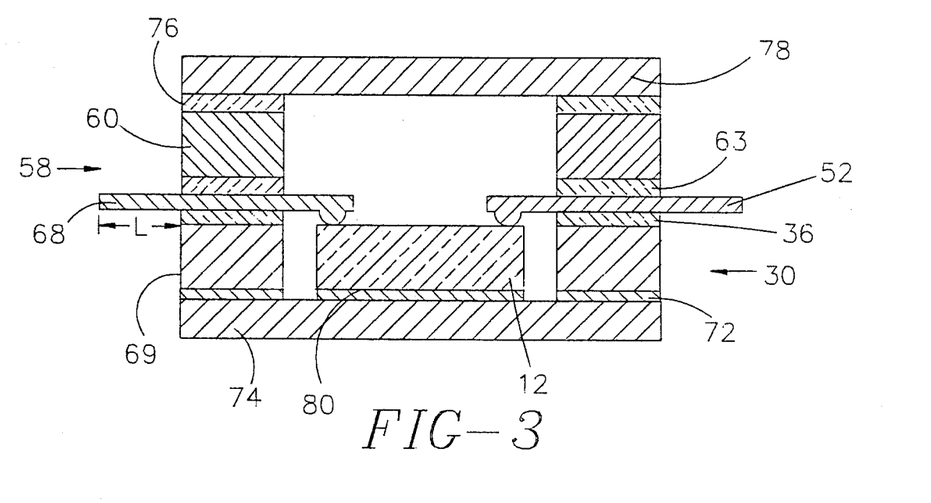
FIG. 3 shows in cross section a hermetic package assembled in accordance with the present invention.

Once the electrical integrity of the semiconductor device 12 has been verified, the electronic package is completed, as illustrated in FIG. 3. The first ring frame 30 is severed along the outer edge 69 of the outer slots so that lead portion 68 extends for a distance, L, beyond the wall of the test frame 58. Since the outer slots were wider than the thickness of the first ring frame, the length, L, of the lead ends 68 is sufficient to extend beyond the base of the package for attachment to a second device or substrate. Base component 74 and lid component 78 are bonded to the test frame by bonding means 72 and 76. The bonding means may be a solder, a polymer adhesive such as epoxy or a sealing glass. For ease of assembly and hermeticity, a low melting solder is preferred. For example, a solder comprised of a 60% lead and 40% tin alloy would be satisfactory. To facilitate soldering, the base and lid components may be coated with a second material such as electroplated tin, gold nickel, or alloys thereof or other desired materials.

While the base 74 and lid 78 components may be manufactured from any desired fairly rigid material, a ceramic or metal is preferred for strength and hermeticity. Preferably, the coefficient of thermal expansion of the base 74 and lid 78 component materials are close to that of the test frame to minimize stresses within the package. A most preferred alloy for the base and lid components is copper alloy C70250 because of the alloy's high thermal conductivity and high strength after exposure to soldering temperatures.

To supply electrical contact to the base of the semiconductor device 12 and to improve thermal dissipation of heat generated during operation of the device, the semiconductor device is bonded to the package base 74 by die attach means 80. The die attach may be a metallic alloy such as lead-tin or gold-tin or other materials, as desired, such as silver filled glass or silver filled epoxy.

While the use of very thin leads 52 permits narrow lead widths and high lead counts, the leads lack structural strength and are easily distorted. The portion of the leads 52 embedded in the sealing glasses 36, 63 is held rigidly in place. However, the free standing, unsupported lead ends are not and care must be taken to ensure that the lead ends 68 do not deflect and contact one another or the package components to create an electrical short.

Figure 4:
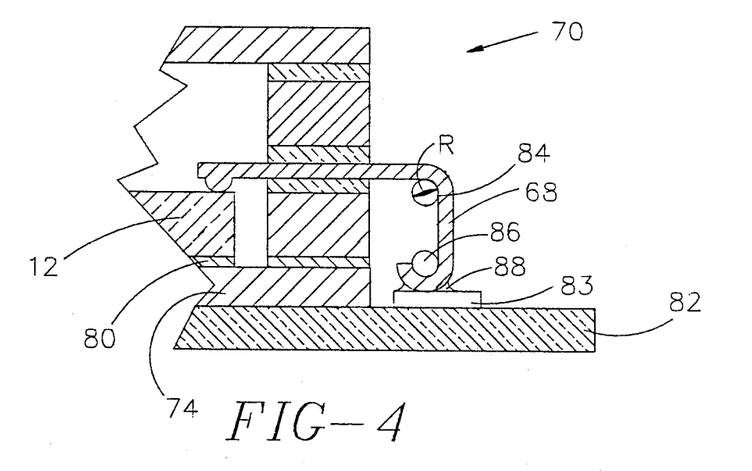
FIG. 4 illustrates a means for shaping the exterior ends of the leads in accordance with one embodiment of the invention.

FIG. 4 illustrates an embodiment of the present invention which solves the problem of lead end 68 distortion. The assembled package 70 is mounted on a substrate 82, for example, a printed circuit board. The substrate contains electrical circuit connections 83 to permit the interconnection of different electrical devices. Lead ends 68 are bent around first 84 and second 86 filaments to provide separation from th package and to form the leads into a "J" shape for soldering to the printed circuit board. The filaments 84, 86 are essentially round in cross section and comprised of an electrically non-conductive material as desired, for example a high strength thermoplastic, such as nylon, or a glass. One particularly well suited material is a plastic coated glass fiber. Optical fibers coated (buffered) with nylon or HYTREL which are readily available work quite well.

The filaments 84, 86 have a radius, R, selected to give a desired lead radius and are positioned as shown in FIG. 4. They are held in place by any convenient means, for example, an epoxy adhesive or heat bonding. The leads are bent around the first 84 and second 86 filaments and then positioned on the substrate 82. The lead ends 68 are bonded to the substrate 82 by solder joint 88. The solder used for this joint is any commonly used low melting solder, for example, alloys of lead and tin.

Figure 5:
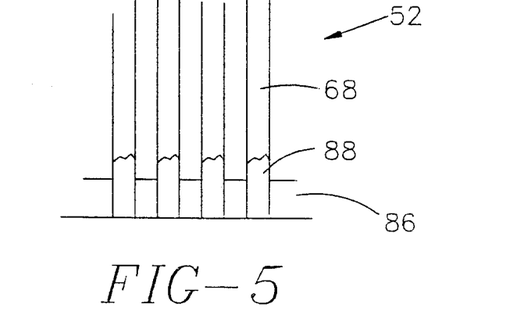
FIG. 5 shows a means for limiting solder bridging between exterior ends of the leads.

By using plastic coated glass filaments 84, 86, another advantage of the present invention, as illustrated in FIG. 5, is achieved. The plastic coating softens during soldering permitting lead ends 68 to embed slightly in the plastic coating. The plastic coating acts as a solder dam and prevents bridging of the solder 88 from one lead 52 to the next.

The lead ends 68 are not limited to the "J" shape. Proper positioning of the filaments will permit formation of "gull shaped" leads 52 or any other desired shape to facilitate bonding the package to a desired substrate.

The patents and patent applications set forth in this application are intended to be incorporated in their entireties by reference herein.

It is apparent there has been provided in accordance with this invention a glass sealed package with a high lead density and a process for the assembly of such a package which satisfy the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A test frame adapted to support and electrically connect to an electronic device, comprising:
   a first ring frame containing a plurality of interior slots incompletely circumscribing a central portion of said first ring frame and a plurality of external slots incompletely circumscribing both said central portion of said first ring frame and said interior slots;
   a second ring frame sized to fit within an area defined by the inner edges of said exterior slots and the outer edges of said interior slots;
   a metallic foil disposed between said first and second ring frames; and
   a means for bonding said metallic foil to said first and second ring frames.

2. The test frame of claim 16 wherein said first and second ring frames are metal or a metal alloy.

3. The test frame of claim 2 wherein said first and second ring frames are copper or a copper based alloy.

4. The test frame of claim 3 wherein said first and second ring frames are comprised of a copper alloy consisting essentially of from about 10% to about 15% nickel, from about 1% to about 3% aluminum, up to about 1% manganese, from about 0.05% to less than about 0.5% magnesium and the balance copper.

5. The test frame of claim 4 wherein said metallic foil is formed into a tape leadframe, said leadframe comprised of lead ends and lead fingers, said lead fingers adapted to electrically connect to said electronic device.

6. The test frame of claim 5 wherein said tape leadframe is copper or a copper alloy.

7. The test frame of claim 6 wherein the thickness of said tape leadframe is less than about 0.010 inches thick.

8. The test frame of claim 7 wherein the thickness of said tape leadframe is less than about 0.005 inches thick.

9. The test frame of claim 8 wherein the thickness of said tape leadframe is from about 0.0007" to about 0.0028" inches thick.

10. The test frame of claim 9 wherein the means for bonding said tape leadframe to said first and second ring frames is a sealing glass.

11. The test frame of claim 10 wherein said sealing glass has a coefficient of thermal expansion in excess of $160 \times 10^{-7}$ in/in/°C.

12. The test frame of claim 11 wherein said sealing glass has a coefficient of thermal expansion approximately equal to the coefficient of thermal expansion of said first and second ring frames.

13. The test frame of claim 12 wherein said sealing glass has a composition consisting essentially of at least 50 molar percent $SiO_2$, from about 10 to about 20 molar percent BaO, from about 20 to about 30 molar percent of an alkaline oxide component selected from the group consisting of $Na_2O$, $K_2O$ and $Li_2O$, up to about 5 molar percent $Al_2O_3$ and up to about 10 percent of an additive, said additive selected from the group consisting of $B_2O_3$, $P_2O_5$, MgO, CaO, $GeO_2$, SrO, PbO and mixtures thereof.

14. The test frame of claim 1 wherein the inner edge of said interior slots is severable subsequent to bonding.

15. The test frame of claim 14 wherein the area defined by the inner edges of said interior slots is less than the area defined by the dimensions of said electronic device and the area defined by the outer edges of said interior slots is greater than the area defined by said electronic device.

16. The test frame of claim 15 wherein the width of said exterior slots is greater than the height of said first ring frame.

17. The test frame of claim 5 wherein at one end said leads terminate at test pads.

18. A package adapted to house an electronic device, comprised of:
   a base component;
   a cover component;
   a first ring frame containing a plurality of interior slots incompletely circumscribing a central portion of said first ring frame and a plurality of external slots incompletely circumscribing both said central portion of said first ring frame and said interior slots;
   a second ring frame sized to fit within an area defined by the inner edges of said exterior slots and the outer edges of said interior slots;
   a tape leadframe disposed between said first and second ring frames;
   a means for bonding said first ring frame to said second ring frame with said tape leadframe disposed there between; and
   a means for bonding said first ring frame to said base component and said second ring frame to said cover component.

19. The package of claim 18 in which the means for bonding said first and second ring frames is a sealing glass with a coefficient of thermal expansion about equal to that of said first and second ring frames.

20. The package of claim 19 in which said first and second ring frames are comprised of copper or a copper based alloy.

21. The package of claim 20 in which said first and second ring frames are comprised of a copper alloy consisting essentially of from about 10% to about 15% nickel, from about 1% to about 3% aluminum, up to about 1% manganese, from about 0.05% to less than about 0.5% magnesium and the balance copper.

22. The package of claim 21 in which said means for bonding said base component to said first ring frame and said lid component to said second ring frame is selected from the group consisting of solder glasses, metallic solders and polymer adhesives.

23. The package of claim 22 wherein said base component and said lid component are comprised of copper or a cooper base alloy.

24. The package of claim 23 wherein said base component and said lid component are comprised of a copper alloy consisting essentially of from about 2% to about 4.8% nickel, from about 0.2% to about, 1.4% silicon, from about 0.05% to about 0.45% magnesium and the balance copper.

25. The package of claim 22 in which said means for bonding said base component to said first ring frame and said lid component to said second ring frame is a solder glass with a coefficient of thermal expansion about equal to that of said base component and said lid component.

26. The package of claim 22 in which said means for bonding said base component to first ring frame and said lid component to said second ring frame is a solder.

27. The package of claim 26 wherein said base component and said lid component are coated with a second material to facilitate soldering.

28. The package of claim 27 wherein said second material is selected from the group consisting of nickel, gold and tin and alloys thereof.

29. The package of claim 18 wherein the interior slots of said first ring frame are severable subsequent to bonding of said first ring frame to said second ring frame.

30. The package of claim 29 wherein the area defined by the inner edges of said interior slots is less than the area defined by the dimensions of said electronic device and the area defined by the outer edges of said interior slots is greater than the area defined by said electronic device.

31. The package of claim 30 wherein the width of said exterior slots is greater than the height of said first ring frame.

32. The package of claim 19 wherein said tape leadframe extends outwardly from said central portion of said first ring frame and extends beyond said base component, said outward lead ends having a desired radius to avoid contact with said base component and to facilitate soldering to a substrate.

* * * * *

UNITED STATES PATENT AND TRADEMARK OFFICE
CERTIFICATE OF CORRECTION

PATENT NO. : 4,967,260
DATED : October 30, 1990
INVENTOR(S) : Butt

It is certified that error appears in the above—identified patent and that said Letters Patent is hereby corrected as shown below:

On the front face of the patent at (73) Assignee: please delete "International Electronic Research Corp, Burbank, Calif." and insert ---Olin Corporation, New Haven, Ct.--- in its place.

On the face of the patent at Attorney, Agent or Firm, please delete "Beehler & Pavitt" and insert ---Gregory S. Rosenblatt Paul Weinstein--- in its place.

Signed and Sealed this

Eighteenth Day of February, 1992

Attest:

HARRY F. MANBECK, JR.

*Attesting Officer*      *Commissioner of Patents and Trademarks*